US012780648B2

(12) United States Patent
Ecton et al.

(10) Patent No.: US 12,780,648 B2
(45) Date of Patent: Nov. 3, 2026

(54) SELF-ALIGNED AIR GAP FORMATION IN MICROELECTRONICS PACKAGES

(71) Applicant: Intel Corporation, Santa Clara, CA (US)

(72) Inventors: Jeremy D. Ecton, Gilbert, AZ (US); Brandon C. Marin, Gilbert, AZ (US); Srinivas Venkata Ramanuja Pietambaram, Chandler, AZ (US); Oladeji Fadayomi, Maricopa, AZ (US); Oscar Ojeda, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 170 days.

(21) Appl. No.: 17/954,522

(22) Filed: Sep. 28, 2022

(65) Prior Publication Data

US 2024/0101413 A1 Mar. 28, 2024

(51) Int. Cl.
*B81B 7/00* (2006.01)
*B81C 1/00* (2006.01)

(52) U.S. Cl.
CPC ........ *B81B 7/0006* (2013.01); *B81C 1/00095* (2013.01); *B81C 1/00523* (2013.01); *B81C 1/00611* (2013.01); *B81B 2207/07* (2013.01); *B81C 2201/0123* (2013.01)

(58) Field of Classification Search
CPC .............. B81B 7/0006; B81B 2207/07; B81C 1/00095; B81C 1/00523; B81C 1/00611; B81C 2201/0123; H01L 23/5385; H01L 21/4857; H01L 23/5383; H01L 23/552
See application file for complete search history.

(56) References Cited

U.S. PATENT DOCUMENTS

2014/0070380 A1* 3/2014 Chiu ................ H10P 14/69215
438/107

* cited by examiner

*Primary Examiner* — Mohammad A Rahman
(74) *Attorney, Agent, or Firm* — Essential Patents Group, LLP

(57) ABSTRACT

Disclosed herein are microelectronics package architectures having self-aligned air gaps and methods of manufacturing the same. The microelectronics packages may include first and second substrates, first and second traces, and a photosensitive material. The first trace may be attached to the first substrate and comprise a first sidewall. The second trace may be attached to the first substrate and comprise a second sidewall. The second traced may be spaced a distance from the first trace with the second sidewall facing the first sidewall. First and second portions of the photosensitive material may be attached to the first and second sidewalls, respectively. The second substrate may be attached to the first and second traces. The first and second substrates and the first and second traces may form the air gap in between the first and second traces.

24 Claims, 11 Drawing Sheets

SELF-ALIGNED AIR GAP FORMATION IN MICROELECTRONICS PACKAGES

FIELD OF THE DISCLOSURE

The present subject matter relates to microelectronics packages. More specifically, the present disclosure relates microelectronics packages having self-aligned air gaps and methods of manufacturing the same.

BACKGROUND

Microelectronics generally include a central processing unit (CPU). In order to enhance performance, CPU products are increasingly integrating multiple dies within the CPU package in a side-by-side or other multi-chip module (MCM) format. The various components of microelectronics can be connected by traces that carry signals and power between the components. However, high speed signaling is prone to degradation caused by cross talk or signal degradation/interference on account of neighboring signal traces.

BRIEF DESCRIPTION OF THE FIGURES

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Figure 1A:
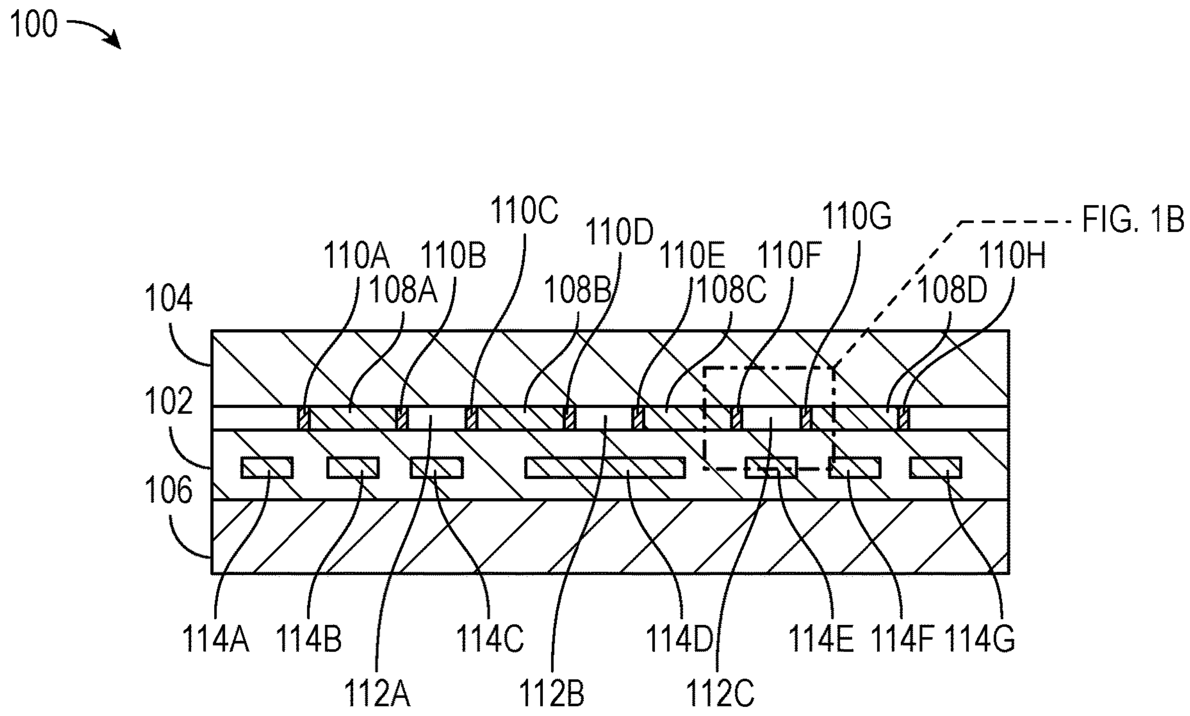
FIG. 1A shows a microelectronics package in accordance with at least one example of this disclosure.

As disclosed herein, an approach for reducing cross talk and improving signal integrity is by incorporating air gaps into a dielectric between signal traces. Disclosed herein is self-aligned air gap formation without the alignment risks. For example, self-aligned air gap creation may be incorporated where a signal trace is formed utilizing either a wet or dry etching process. Positive type photo-imageable dielectric may be used to encapsulate the trace with a thin coating defined by the undercut of the process. The encapsulation of the trace may be achieved by using the undercut beneath the initial resist or hard mask as a shadow region during flood exposure. Stated another way, the resist or hard mask may act as an embedded contact mask for a flood exposure process, resulting in a self-aligned pattern.

Advantages of the systems and methods disclosed herein may include higher resolution and better control of air gap pattern. Compromises may not be needed to relax pitch to account for alignment error for patterning air gap as in conventional approaches. Larger air gaps between signal traces may be created. Thinner encapsulation of the signal trace may allow for larger air gaps between neighboring signal traces, which may translate to reduced crosstalk and better performance. Using the process flows disclosed herein, a second lithography step (i.e., aligned lithography) to pattern the air gap, which is costly, and impacts run rate, is not needed.

By implementing a self-aligning process as disclosed herein, the process flow is not only simplified, utilizing lower cost tools (i.e., low-cost lamp for flood exposure may be used and alignment tools/components may not be needed as in lithography patterning), which may also reduce run rates. In addition, reliability risks related to alignment error may be eliminated due to the air gap pattern being self-aligned to the signal trace.

Microelectronic packages disclosed herein may include first and second substrates. A plurality of traces may be attached to the first substrate and spaced apart from one another. Each of the plurality of traces may include first and second sidewalls. The first sidewall has a first portion of a photosensitive material attached thereto and the second sidewall has a second portion of a photosensitive material attached thereto. The first sidewall of a first of the plurality of traces may face the second sidewall of a second of the plurality of traces. The second substrate may be attached the plurality of traces. The first and second substrates and the plurality of traces may form a plurality of air gaps between respective ones of the plurality of traces.

As disclosed herein, the first and second sidewalls each may be planar or curved, such as having a concaved profile. Each of the first and second sidewalls may form a tapered undercut region. Any number of the traces, such as a first subset of traces, may be electrical traces and any number of traces, such as a second subset of traces, may be electrically non-functional traces.

The above discussion is intended to provide an overview of subject matter of the present patent application. It is not intended to provide an exclusive or exhaustive explanation. The description below is included to provide further information.

Figure 1B:
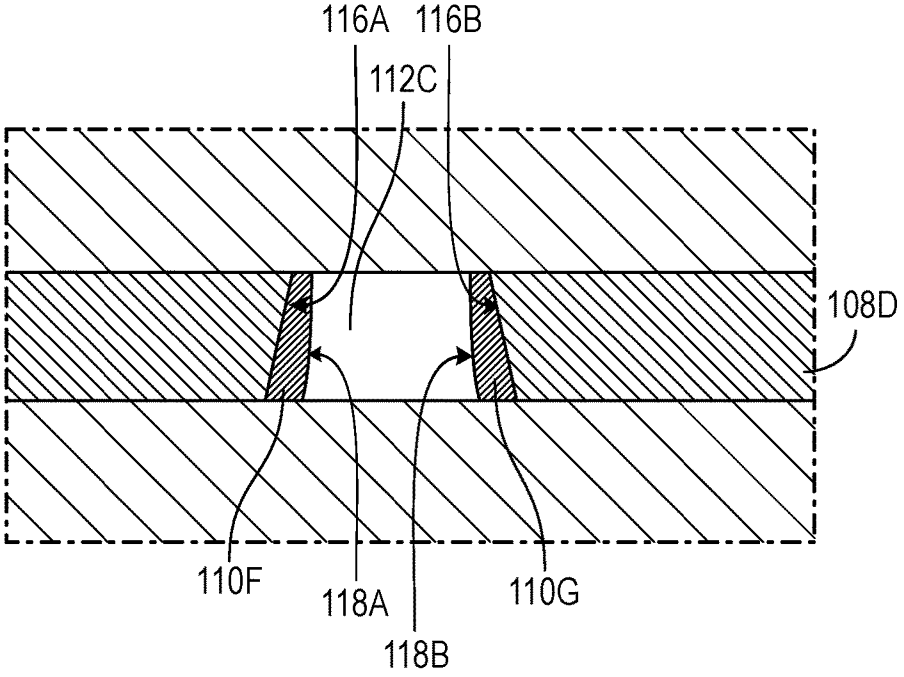
FIG. 1B shows a detail of the microelectronics package in FIG. 1A in accordance with at least one example of this disclosure.

Turning now to the figures, FIGS. 1A and 1B show a microelectronics package 100 in accordance with at least one example of this disclosure. Microelectronics package 100 may be formed using a dry etching process as disclosed herein. Microelectronics package 100 may include a first substrate 102, a second substrate 104, a carrier 106, traces 108 (labeled individually as traces 108A, 108B, 108C, and 108D), and portions of photosensitive material 110 (labeled individually as portions of photosensitive material 110A, 110B, 110C, 110D, 110E, 110F, 110G, and 110H). First and second substrates 102, 104, traces 108, and portions of photosensitive material 108 may form air gaps 112 (labeled individually as air gaps 112A, 112B, and 112C). First substrate 102 may include one or more traces 114 (labeled individually as traces 114A, 114B, 114C, 114D, 114E, 114F, and 114G).

As shown in FIG. 1B, the dry etching process may result in surfaces 116 (labeled individually as surfaces 116A and 116B) of traces 110F and 110G, respectively, having a planar profile that forms a tapered undercut region. The tapered undercut region may be filled with portions of photosensitive material 110F and 110G, respectively. Surfaces 118 (labeled individually as surfaces 118A and 118B) of portions of photosensitive material 110F and 110G may have a curved (e.g., a convex) profile.

As shown in FIGS. 1A and 1B, traces 108 may be spaced a distance from each other with sidewalls, such as surfaces 116A and 116B, facing one another. Sidewalls, such as surfaces 118, may be spaced apart from one another as well to form air gaps 112. Air gaps 112 may be symmetric about centerlines of air gaps 112.

As disclosed herein, self-aligned air gaps may be created during a dry etching process. The profile of a dry etching process vs. a self-aligned exposure process may differ. For example, a copper/photosensitive material interface may be straight, characteristic of a positive type lithography exposure process and the photosensitive material/air interface may be curved, characteristic of dry etch profile. Also, the material may incorporate a positive photosensitive material, which is unique. Some possible candidates for the positive photosensitive material include, but is not limited to, diazoalkylquinone, diazobenzoquinone, or diazonaphthoquinone with an ester backbone, which generates a photo-acid that cleaves the ester. Also, no offset would be observed with equivalent photosensitive material encapsulation widths since the undercut would be equal on either side of traces 108.

FIGS. 2A, 2B, 2C, and 2D show a process flow 200 for manufacturing a microelectronics package, such a microelectronics package 100, in accordance with at least one example of this disclosure. Process flow 200 may begin at stage 201, where a sacrificial film 204 may be deposited, attached, or otherwise formed on a substrate 206 attached to a carrier 208. Substrate 206 may include traces 210. Sacrificial film 204 may be a resist material or thermal decomposable polymer deposited onto substrate 206.

A hard mask 212 may be deposited on sacrificial film 204 (214). Hard mask 212 may initially be a solder mask and may be etched to form openings 216. Hard mask 212 may also be formed such that openings 216 are present during forming of hard mask 212.

Sacrificial film 204 may be etched to form holes 218 in sacrificial film 204 to reveal portions of first substrate 206 (220). The etching process may form undercut regions 222. A photo-imageable material 224, sometimes called a photosensitive material, may be deposited onto substrate 206 to fill holes 218, including undercut regions 222, formed in sacrificial film 202 (226). Photo-imageable material 224 may be exposed to light 228 (230). Undercut regions 222 may not be exposed to light 228 due to an overhanging portion of hard mask 212. Stated another way, hard mask 212 may act as a contact mask and photo-imageable materials 224 beneath hard mask 212 is not activated by light 228 in undercut regions 222.

Exposed, sometimes called developed, portions of photo-imageable material 224 may be removed without removing portions of photo-imageable material 224 within undercut regions 222 (232). Removing the exposed portions of photo-imageable material 224 may include forming a convex portion in photo-imageable material 224 as shown in FIG. 1B.

With portions of photo-imageable material 224 removed, traces 234 may be formed within holes formed by removing the exposed portions of the phot-imageable material 224 (236). Traces 234 may be formed by an over-plating process, a deposition process, a sputtering process, etc. Traces 234 are planarized (238). Forming traces 234 may include forming at least one non-functional trace.

With traces 234 formed and planarized, hard mask 212 may be removed (240). With hard mask 212 removed, any remaining sacrificial film 204 may be removed (242). Hard mask 212 and any remaining sacrificial film 204 may be removed via etch, laser ablation, etc.

With sacrificial film 204 fully removed, a second substrate 244 may be attached to traces 234 (246). Attaching second substrate 244 to traces 234 may form air gaps 248. Attaching second substrate 244 may be accomplished by a dielectric lamination process and a primer may be used prevent filling in air gaps 248 during the attachment process.

Figure 3A:
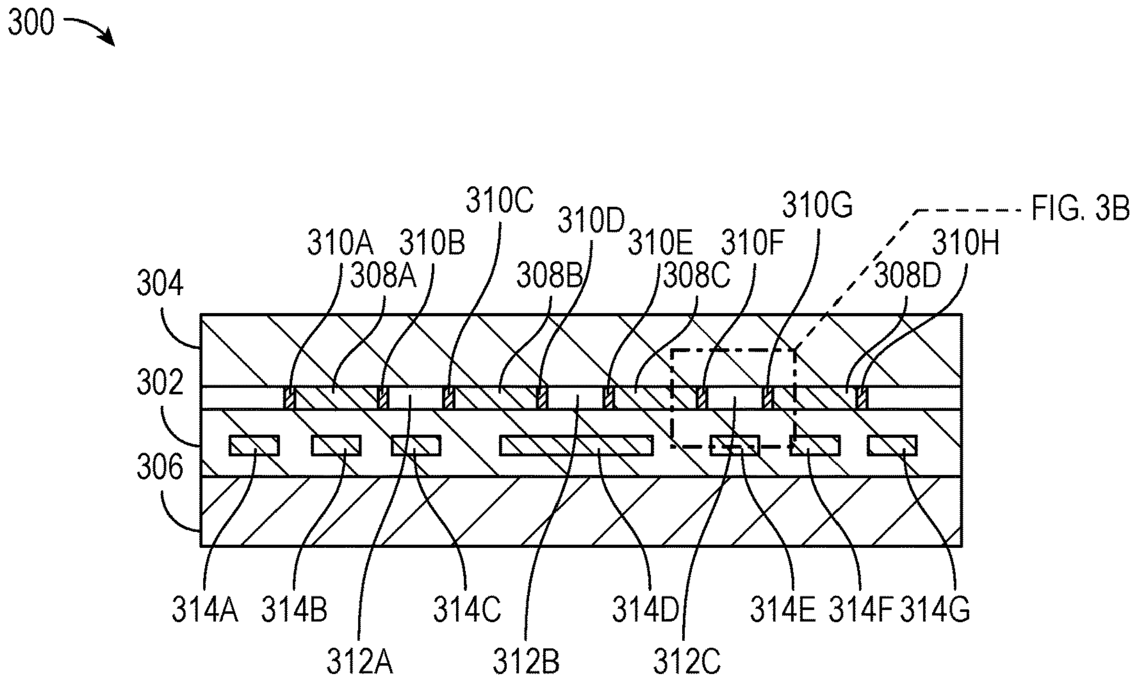
FIG. 3A shows a microelectronics package in accordance with at least one example of this disclosure.
Figure 3B:
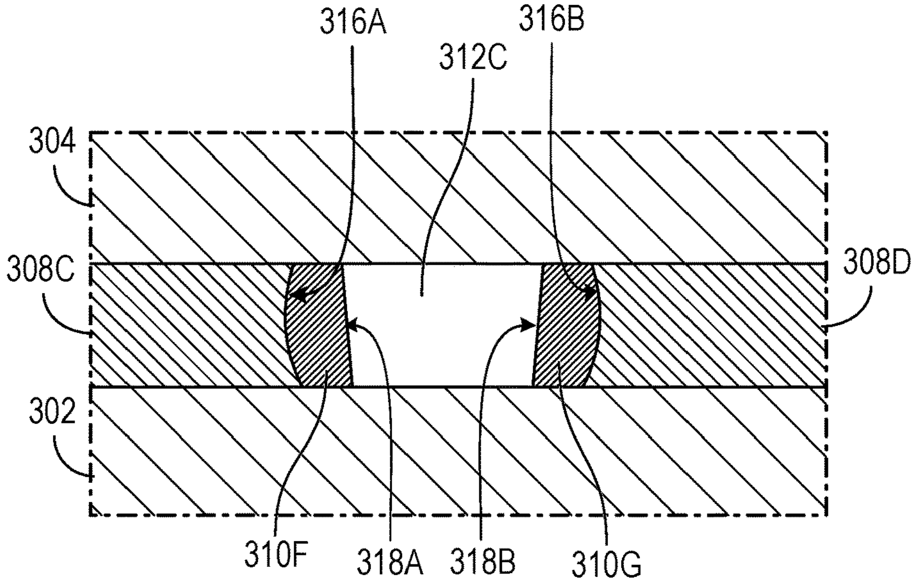
FIG. 3B shows a detail of the microelectronics package in FIG. 1A in accordance with at least one example of this disclosure.

FIGS. 3A and 3B show a microelectronics package 300 in accordance with at least one example of this disclosure. Microelectronics package 300 may be formed using a wet etching process as disclosed herein. Microelectronics package 300 may include a first substrate 302, a second substrate 304, a carrier 306, traces 308 (labeled individually as traces 308A, 308B, 308C, and 308D), and portions of photosensitive material 310 (labeled individually as portions of photosensitive material 310A, 310B, 310C, 310D, 310E, 310F, 310G, and 310H). First and second substrates 302, 304, traces 308, and portions of photosensitive material 308 may form air gaps 312 (labeled individually as air gaps 312A, 312B, and 312C). First substrate 302 may include one or more traces 314 (labeled individually as traces 314A, 314B, 314C, 314D, 314E, 314F, and 314G).

As shown in FIG. 3B, the wet etching process may result in surfaces 316 (labeled individually as surfaces 316A and 316B) of traces 310F and 310G, respectively, having a curved (e.g., a concave) profile that forms an undercut region. The undercut region may be filled with portions of photosensitive material 310F and 310G, respectively. Surfaces 318 (labeled individually as surfaces 318A and 318B) of portions of photosensitive material 310F and 310G may have a planar profile.

As shown in FIGS. 3A and 3B, traces 308 may be spaced a distance from each other with sidewalls, such as surfaces 316A and 316B facing one another. Sidewalls, such as surfaces 318, may be spaced apart from one another as well to form air gaps 312. Air gaps 312 may be symmetric about centerlines of air gaps 312.

As disclosed herein, self-aligned air gaps may be created during a wet etching process. The profile of the wet etching process vs. the self-aligned exposure process may differ. For example, the copper/photosensitive material interface may be curved or hour-glass shaped, characteristic of a wet etching process and the photosensitive material/air interface may be straight, characteristic of a positive type lithography exposure process. Also, the material would incorporate a positive photosensitive material. Some possible candidates for the positive photosensitive material include diazoalkylquinone, diazobenzoquinone, diazonaphtoquinone with an ester backbone, which generates a photo-acid that cleaves the ester. Also, no offset would be observed with equivalent photosensitive material encapsulation widths since the undercut would be equal on either side of traces 308.

Figure 2A:
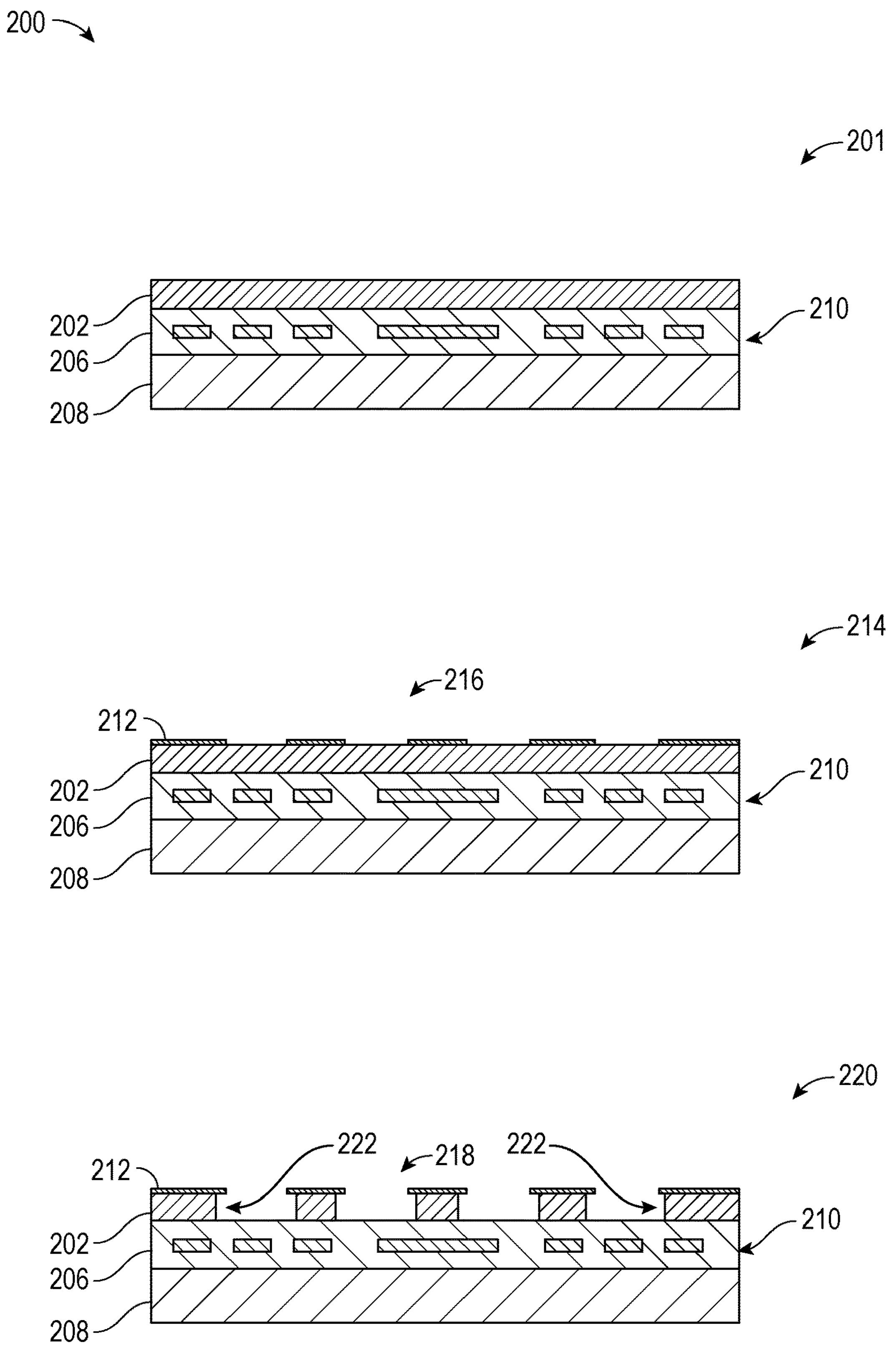
FIGS. 2A, 2B, 2C, and 2D show a process for manufacturing a microelectronics package in accordance with at least one example of this disclosure.
Figure 2B:
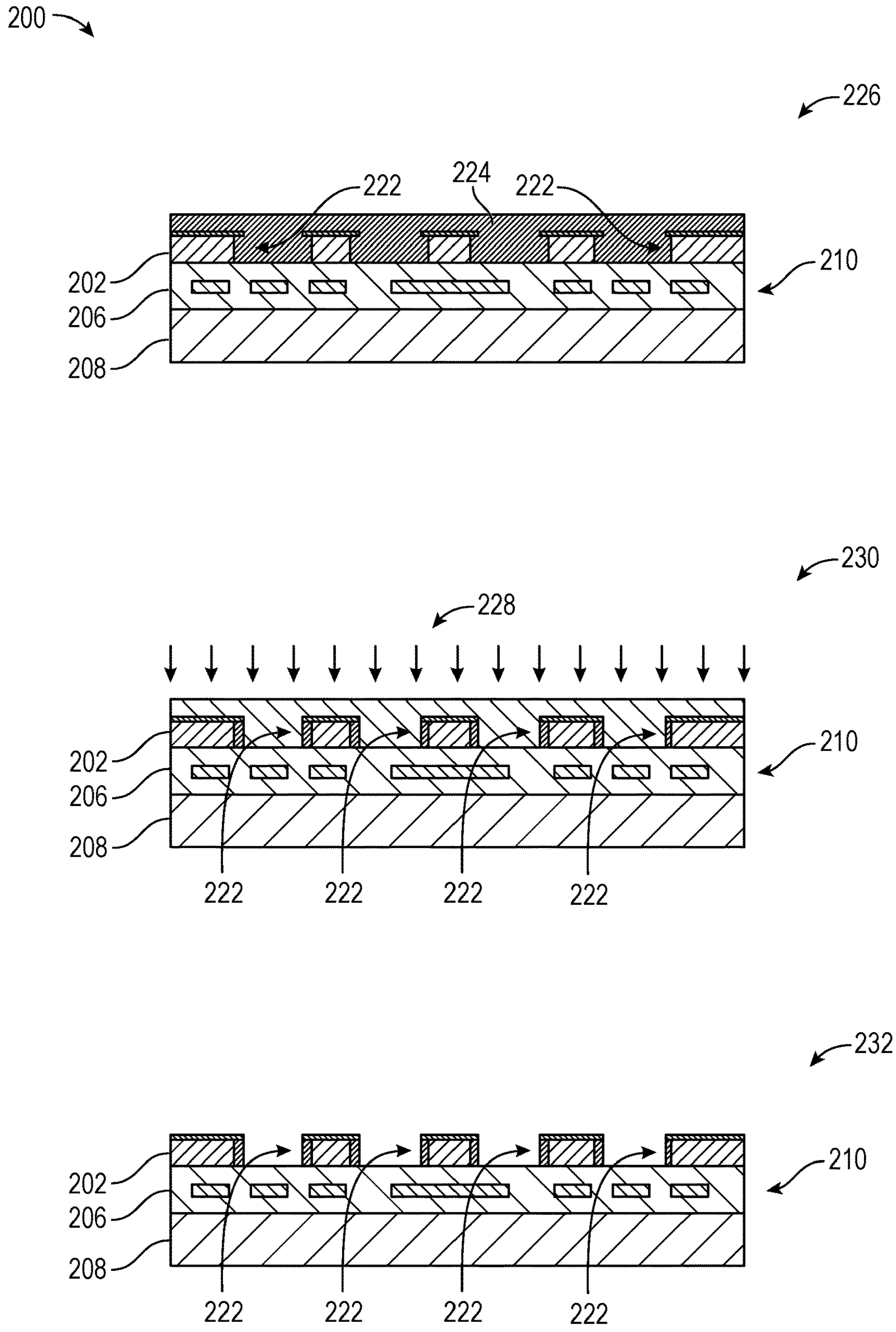
Figure 2C:
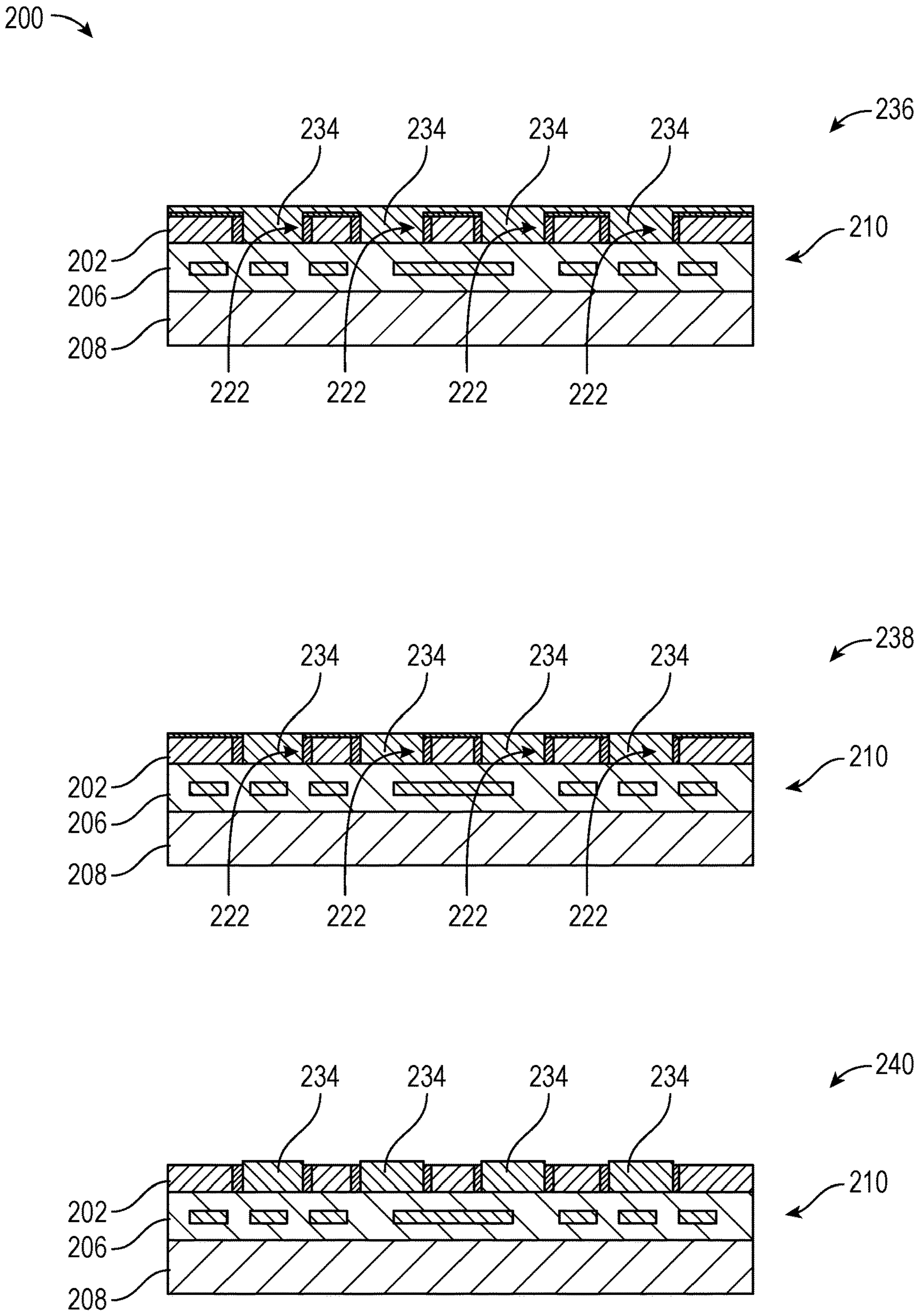
Figure 2D:
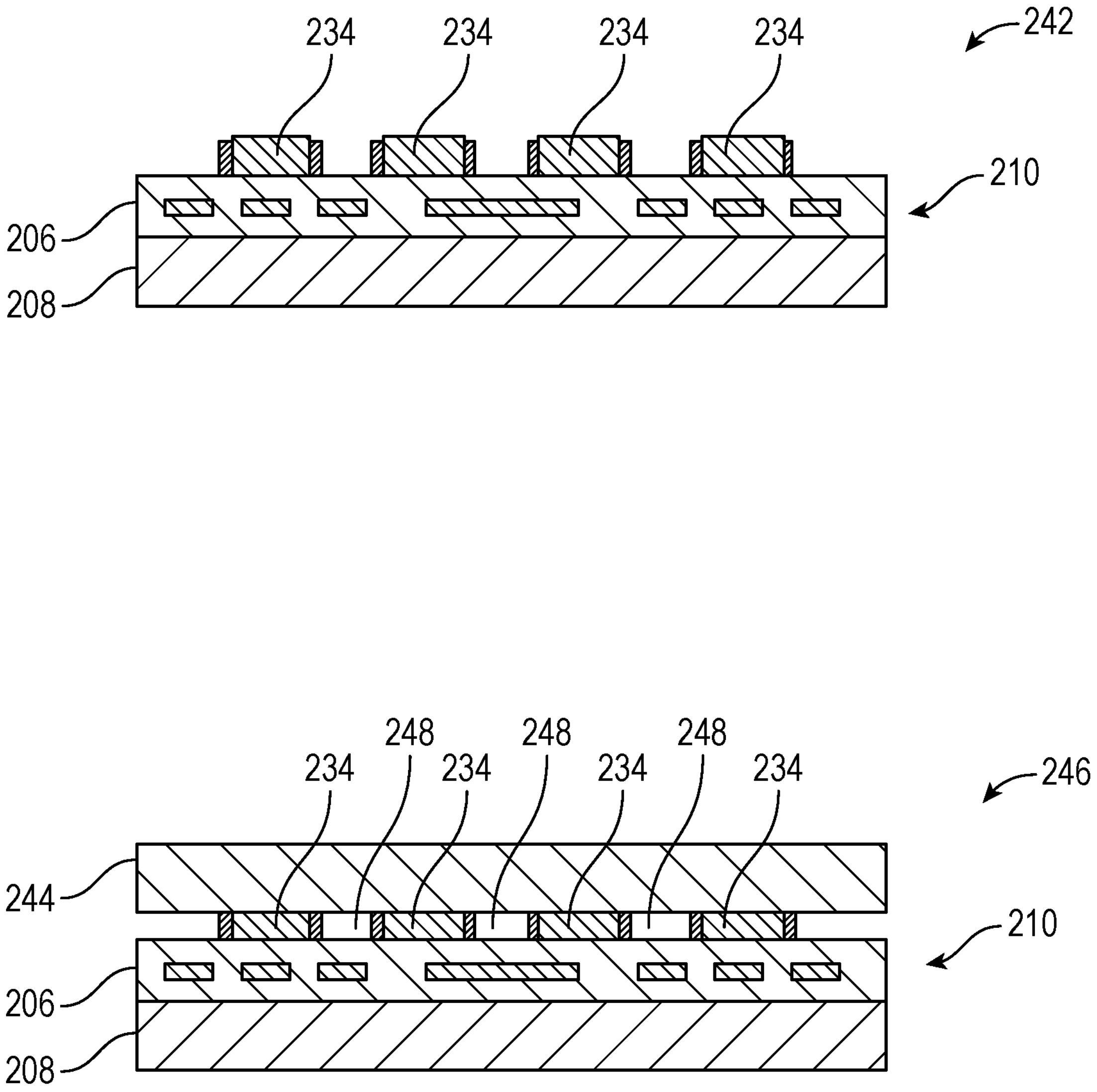
Figure 4A:
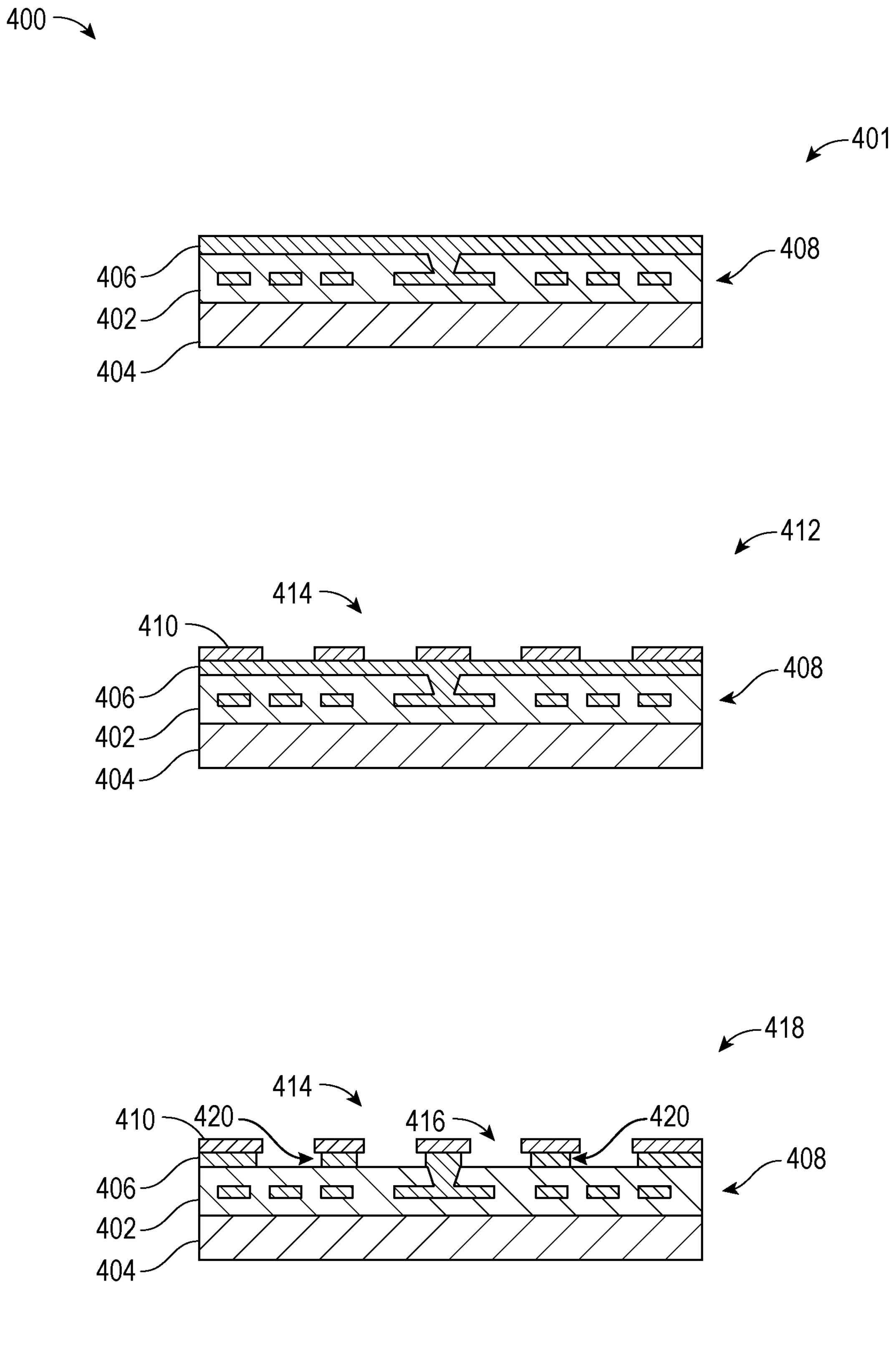
FIGS. 4A, 4B, and 4C show a process for manufacturing a microelectronics package in accordance with at least one example of this disclosure.
Figure 4B:
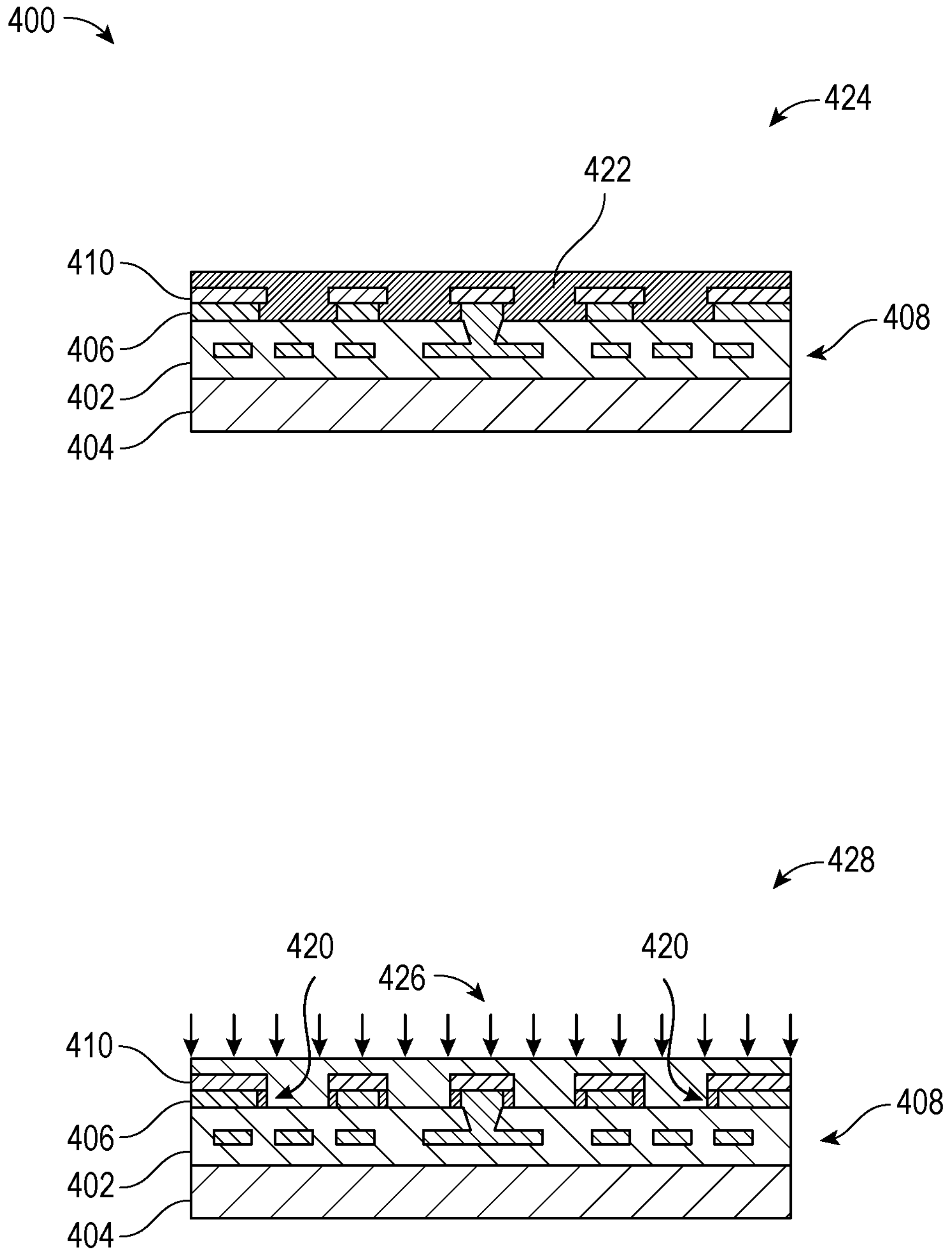
Figure 4C:
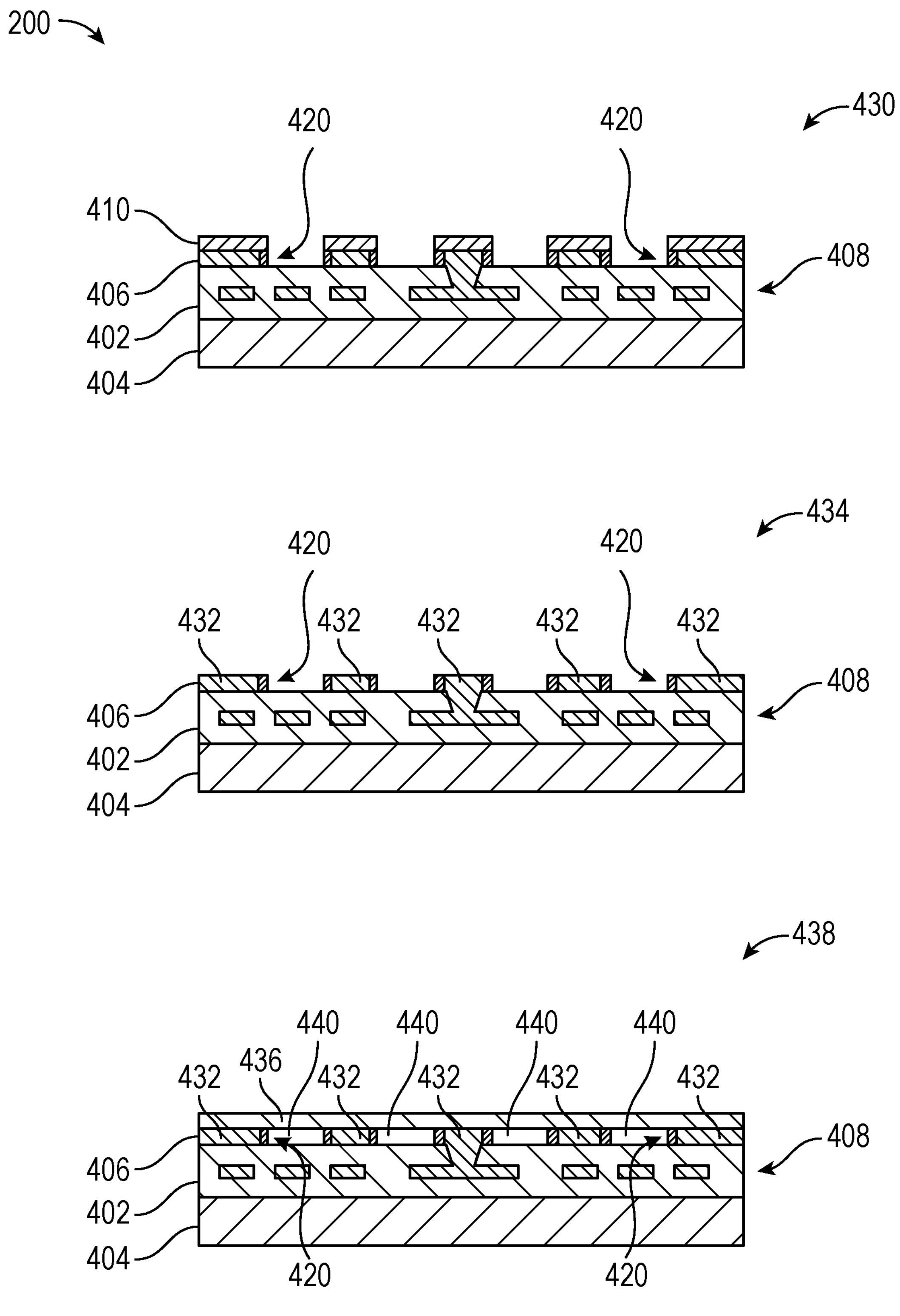

FIGS. 4A, 4B, and 2C show a process flow 400 for manufacturing a microelectronics package, such a microelectronics package 300, in accordance with at least one example of this disclosure. Process flow 300 may begin at stage 401, where a substrate 402 connected a carrier 404 may be blanketed with a metallic material 406 (e.g., copper). Substrate 402 may include traces 408.

A resist material 410 may be deposited on metallic material 406 (412). Resist material 410 may patterned or deposited onto metallic material 406. Resist material may initially be a solder material and may be etched to form openings 414.

Metallic material 406 may be etched, such as by a wet etching process, to form holes 416 in metallic material 406 to reveal portions of substrate 402 (418). The etching process may form undercut regions 420. Forming holes 416 may include forming a concave portion in metallic material 406 as shown in FIG. 3B.

A photo-imageable material 422, sometimes called a photosensitive material, may be deposited onto substrate 402 to fill holes 416, including undercut regions 420 (424). Photo-imageable material 422 may be exposed to light 426 (428). Undercut regions 420 may not be exposed to light 426 due to an overhanging portion of resist material 410. Stated another way, resist material may act as a contact mask and photo-imageable materials 422 beneath resist material 410 is not activated by light 426 in undercut regions 420.

Exposed, sometimes called developed, portions of photo-imageable material 422 may be removed without removing portions of photo-imageable material 422 within undercut regions 420 (430). Removing the exposed portions of photo-imageable material 422 may include forming a planar portion in photo-imageable material 422 as shown in FIG. 1B.

Any remaining resist material 410 may be removed and traces 432 may be formed (434). Traces 432 may be formed by the removal of photo-imageable materials 422 and planarization of metallic material 406. With traces 432 formed, a second substrate 436 may be attached to traces 432 (438). Attaching second substrate 436 to traces 432 may form air gaps 440. Attaching second substrate 436 may be accomplished by a dielectric lamination process and a primer may be used prevent filling in air gaps 440 during the attachment process.

Figure 5A:
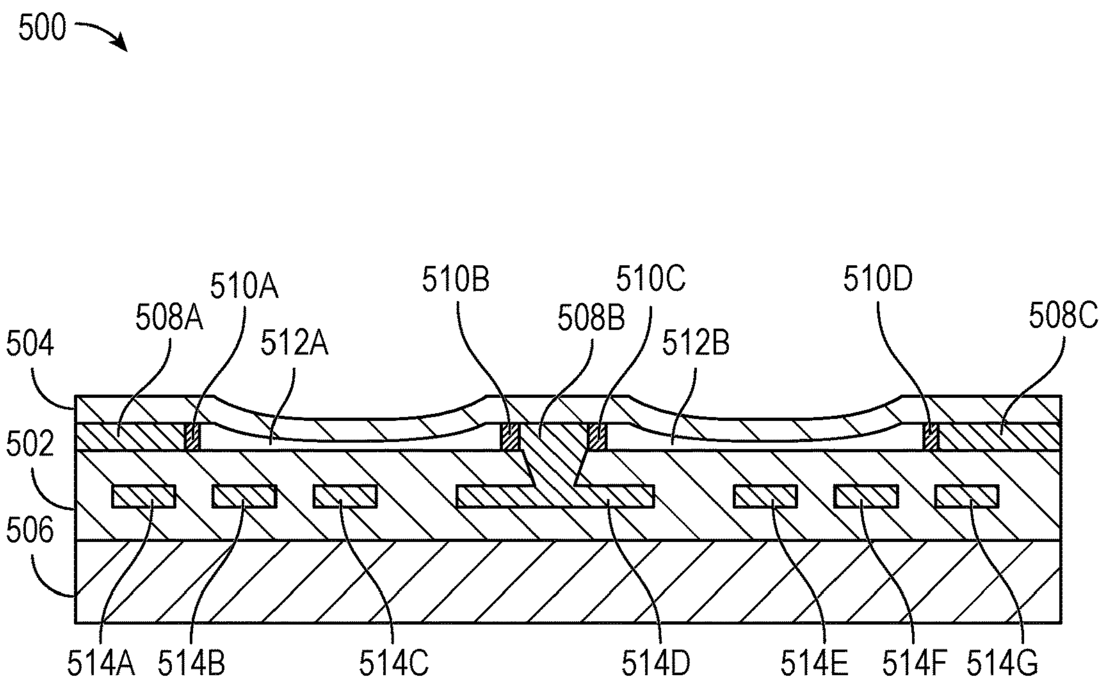
FIGS. 5A and 5B show a microelectronics package in accordance with at least one example of this disclosure.
Figure 5B:
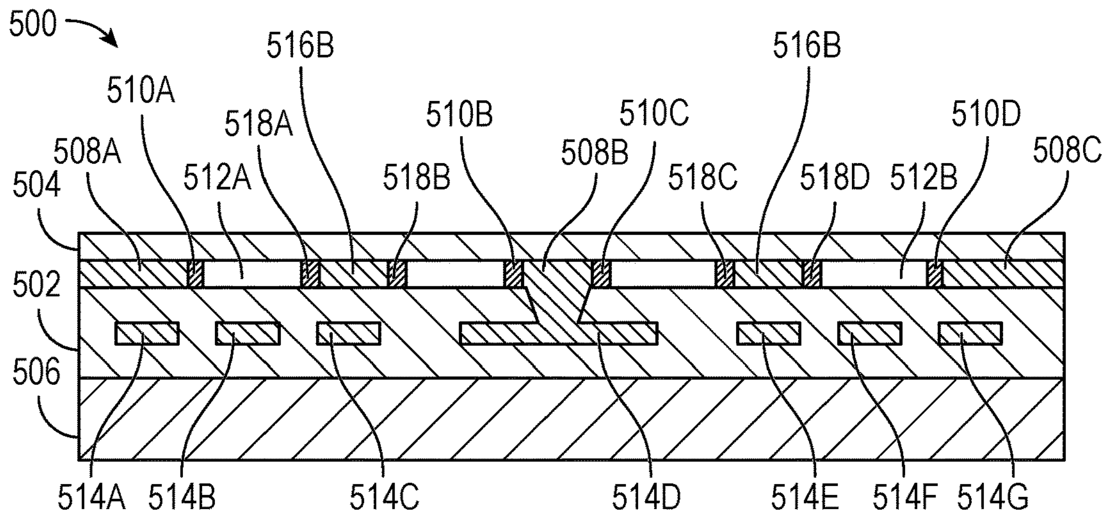

FIGS. 5A and 5B show a microelectronics package 500 in accordance with at least one example of this disclosure. Microelectronics package 500 may be formed using a wet or dry etching process as disclosed herein. Microelectronics package 500 may include a first substrate 502, a second substrate 504, a carrier 506, traces 508 (labeled individually as traces 508A, 508B, and 508C), and portions of photosensitive material 510 (labeled individually as portions of photosensitive material 510A, 510B, 510C, and 510D). First and second substrates 502, 504, traces 508, and portions of photosensitive material 508 may form air gaps 512 (labeled individually as air gaps 512A and 512B). First substrate 302 may include one or more traces 514 (labeled individually as traces 514A, 514B, 514C, 514D, 514E, 514F, and 514G).

As shown in FIG. 5A, traces 508 may be located far from each other and second substrate 504 may sag due to large spacing between traces 508. Stated another way, second substrate 508 may collapse into voids that otherwise form air gaps 512 during lamination. To avoid the collapse, sometimes called tenting, electrically non-functional mechanical supports 516 (labeled individually as supports 516A and 516B), which may be formed as traces as disclosed with respect to process flows 200 and 400 may be formed. Supports 516 may include portions 518 of photosensitive material 510 (labeled individually as portions 518A, 518B, 518C, and 518D).

Supports 516 may or may not be grounded. In other words, supports may be used to provide a ground plane. For example, supports 516 may also be grounded to act as z-dimensional electrical signal shielding. Supports 516 may also be attached after traces 508 are formed and may be free floating to allow for expansion and/or contractions during operation.

Figure 6:
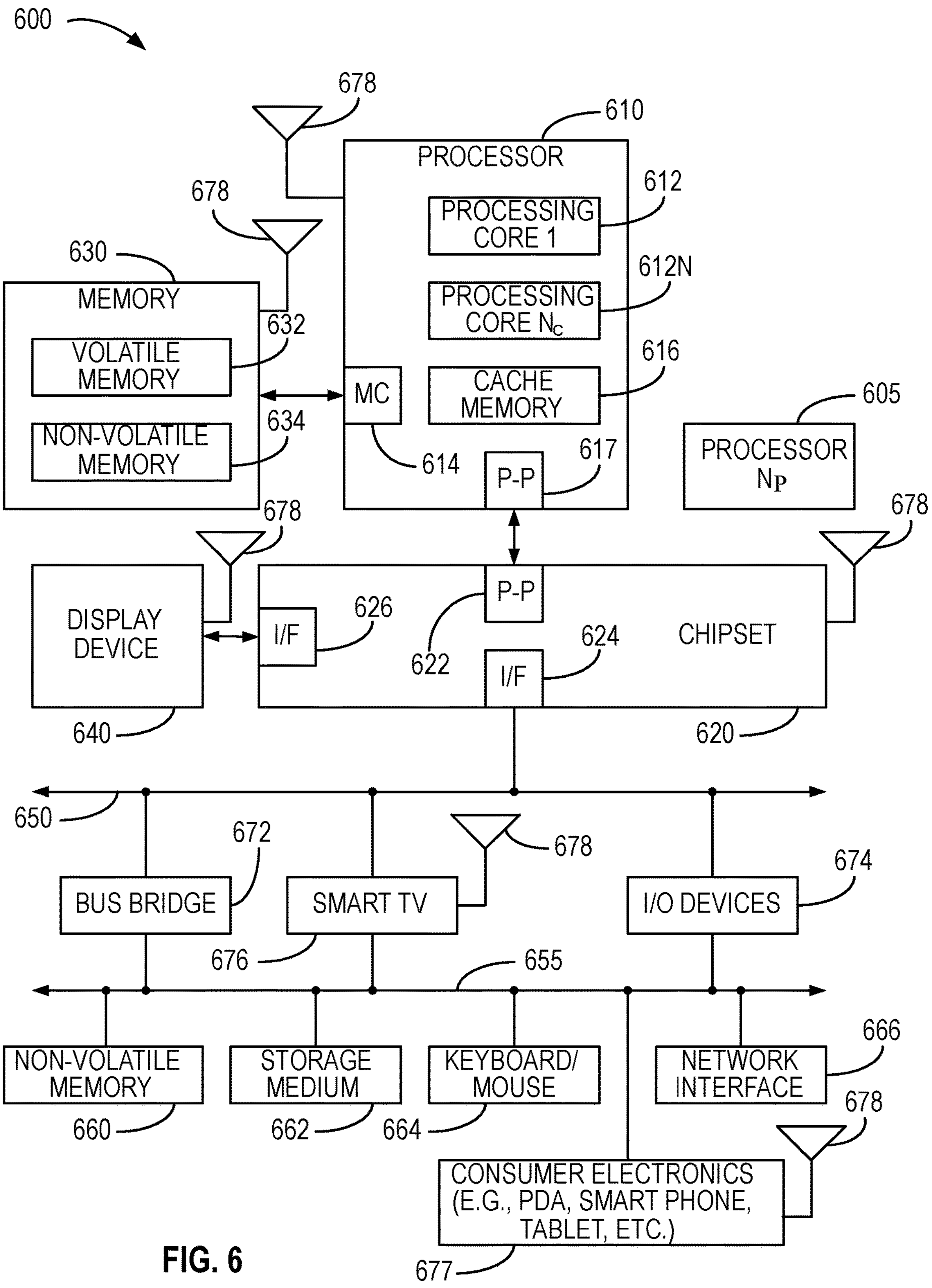
FIG. 6 shows system level diagram in accordance with at least one example of this disclosure.

FIG. 6 illustrates a system level diagram, according to one embodiment of the invention. For instance, FIG. 6 depicts an example of an electronic device (e.g., system) including microelectronics package 100 as described herein. FIG. 6 is included to show an example of a higher-level device application for the present invention. In one embodiment, system 600 includes, but is not limited to, a desktop computer, a laptop computer, a netbook, a tablet, a notebook computer, a personal digital assistant (PDA), a server, a workstation, a cellular telephone, a mobile computing device, a smart phone, an Internet appliance or any other type of computing device. In some embodiments, system 600 is a system on a chip (SOC) system.

In one embodiment, processor 610 has one or more processing cores 612 and 612N, where 612N represents the Nth processor core inside processor 610 where N is a positive integer. In one embodiment, system 600 includes multiple processors including 610 and 605, where processor 605 has logic similar or identical to the logic of processor 610. In some embodiments, processing core 612 includes, but is not limited to, pre-fetch logic to fetch instructions, decode logic to decode the instructions, execution logic to execute instructions and the like. In some embodiments, processor 610 has a cache memory 616 to cache instructions and/or data for system 600. Cache memory 616 may be organized into a hierarchal structure including one or more levels of cache memory.

In some embodiments, processor 610 includes a memory controller 614, which is operable to perform functions that enable the processor 610 to access and communicate with memory 630 that includes a volatile memory 632 and/or a non-volatile memory 634. In some embodiments, processor 610 is coupled with memory 630 and chipset 620. Processor 610 may also be coupled to a wireless antenna 678 to communicate with any device configured to transmit and/or receive wireless signals. In one embodiment, the wireless antenna interface 678 operates in accordance with, but is not limited to, the IEEE 802.11 standard and its related family, Home Plug AV (HPAV), Ultra Wide Band (UWB), Bluetooth, WiMax, or any form of wireless communication protocol.

In some embodiments, volatile memory 632 includes, but is not limited to, Synchronous Dynamic Random Access Memory (SDRAM), Dynamic Random Access Memory (DRAM), RAMBUS Dynamic Random Access Memory (RDRAM), and/or any other type of random access memory device. Non-volatile memory 634 includes, but is not limited to, flash memory, phase change memory (PCM), read-only memory (ROM), electrically erasable programmable read-only memory (EEPROM), or any other type of non-volatile memory device.

Memory 630 stores information and instructions to be executed by processor 610. In one embodiment, memory 630 may also store temporary variables or other intermediate information while processor 610 is executing instructions. In the illustrated embodiment, chipset 620 connects with processor 610 via Point-to-Point (PtP or P-P) interfaces 617 and 622. Chipset 620 enables processor 610 to connect to other elements in system 600. In some embodiments of the invention, interfaces 617 and 622 operate in accordance with a PtP communication protocol such as the Intel® QuickPath Interconnect (QPI) or the like. In other embodiments, a different interconnect may be used.

In some embodiments, chipset 620 is operable to communicate with processor 610, 605N, display device 640, and other devices 672, 676, 674, 660, 662, 664, 666, 677, etc. Chipset 620 may also be coupled to a wireless antenna 678 to communicate with any device configured to transmit and/or receive wireless signals.

Chipset 620 connects to display device 640 via interface 626. Display 640 may be, for example, a liquid crystal display (LCD), a plasma display, cathode ray tube (CRT) display, or any other form of visual display device. In some embodiments of the invention, processor 610 and chipset 620 are merged into a single SOC. In addition, chipset 620 connects to one or more buses 650 and 655 that interconnect various elements 674, 660, 662, 664, and 666. Buses 650 and 655 may be interconnected together via a bus bridge 672. In one embodiment, chipset 620 couples with a non-volatile memory 660, a mass storage device(s) 662, a keyboard/mouse 664, and a network interface 666 via interface 624 and/or 604, smart TV 676, consumer electronics 677, etc.

In one embodiment, mass storage device 662 includes, but is not limited to, a solid state drive, a hard disk drive, a universal serial bus flash memory drive, or any other form of computer data storage medium. In one embodiment, network interface 666 is implemented by any type of well known network interface standard including, but not limited to, an Ethernet interface, a universal serial bus (USB) interface, a Peripheral Component Interconnect (PCI) Express interface, a wireless interface and/or any other suitable type of interface. In one embodiment, the wireless interface operates in accordance with, but is not limited to, the IEEE 802.11 standard and its related family, Home Plug AV (HPAV), Ultra Wide Band (UWB), Bluetooth, WiMax, or any form of wireless communication protocol.

While the modules shown in FIG. 6 are depicted as separate blocks within the system 600, the functions performed by some of these blocks may be integrated within a single semiconductor circuit or may be implemented using two or more separate integrated circuits. For example, although cache memory 616 is depicted as a separate block within processor 610, cache memory 616 (or selected aspects of 616) can be incorporated into processor core 612.

Additional Notes

The following, non-limiting examples, detail certain aspects of the present subject matter to solve the challenges and provide the benefits discussed herein, among others.

Example 1 is a microelectronics package comprising: a first substrate; a first trace attached to the first substrate and comprising a first sidewall; a second trace attached to the first substrate and comprising a second sidewall, the second trace spaced a distance from the first trace with the second sidewall facing the first sidewall; first and second portions of a photosensitive material attached to the first sidewall and the second sidewall, respectively; and a second substrate attached to the first and second traces, the first and second substrates and the first and second traces forming an air gap in between the first and second traces.

In Example 2, the subject matter of Example 1 optionally includes wherein the first and second sidewalls each are substantially planar.

In Example 3, the subject matter of any one or more of Examples 1-2 optionally include wherein each of the first and second sidewalls form a tapered undercut region.

In Example 4, the subject matter of any one or more of Examples 1-3 optionally include wherein surfaces of the photosensitive material exposed to the air gap have a curved profile.

In Example 5, the subject matter of any one or more of Examples 1~4 optionally include wherein the first and second sidewalls each are concaved.

In Example 6, the subject matter of any one or more of Examples 1-5 optionally include wherein surfaces of the photosensitive material exposed to the air gap form a tapered undercut region.

In Example 7, the subject matter of any one or more of Examples 1-6 optionally include wherein the first trace is an electrical trace and the second trace is an electrically non-functional trace.

In Example 8, the subject matter of any one or more of Examples 1-7 optionally include wherein at least one of the first trace and the second traces is an electrically non-functional trace.

Example 9 is a microelectronics package comprising: a first substrate; a plurality of traces attached to the first substrate and spaced apart from one another, each of the plurality of traces comprising: a first sidewall having a first portion of a photosensitive material attached thereto, and a second sidewall having a second portion of a photosensitive material attached thereto, the first side wall of a first of the plurality of traces facing the second sidewall of a second of the plurality of traces; and a second substrate attached to the plurality of traces, the first and second substrates and the plurality of traces forming a plurality of air gaps in between respective ones of the plurality of traces.

In Example 10, the subject matter of Example 9 optionally includes wherein the first and second sidewalls of at least a subset of the plurality of traces are substantially planar.

In Example 11, the subject matter of any one or more of Examples 9-10 optionally include wherein the first and second sidewalls of at least a subset of the plurality of traces form tapered undercut regions.

In Example 12, the subject matter of any one or more of Examples 9-11 optionally include wherein surfaces of the photosensitive material exposed to the air gaps have a curved profile.

In Example 13, the subject matter of any one or more of Examples 9-12 optionally include wherein the first and second sidewalls of at least a subset of the plurality of traces are concaved.

In Example 14, the subject matter of any one or more of Examples 9-13 optionally include wherein surfaces of the photosensitive material exposed to the air gaps form tapered undercut regions.

In Example 15, the subject matter of any one or more of Examples 9-14 optionally include wherein a first subset of the plurality of traces are electrical traces and at least one of the plurality of traces is an electrically non-functional trace.

In Example 16, the subject matter of any one or more of Examples 9-15 optionally include wherein at least one of the plurality of traces is an electrically non-functional trace.

Example 17 is a method of manufacturing a microelectronics package, the method comprising: forming a hard mask onto a sacrificial film; etching the sacrificial film to form holes in the sacrificial film to reveal a portion of a first substrate, wherein each of the holes formed in the sacrificial film includes an undercut region; depositing a photo-imageable material onto the substrate to fill the holes, including the undercut regions, formed in the sacrificial film; exposing the photo-imageable material to light; removing exposed portions of the photo-imageable material without removing portions of the photo-imageable material within the undercut regions; forming traces within the holes formed by removing the exposed portions of the phot-imageable material; removing the sacrificial film; and attaching a second substrate to the traces, wherein attaching the second substrate forms a plurality of air gaps.

In Example 18, the subject matter of Example 17 optionally includes depositing the sacrificial film onto the first substrate.

In Example 19, the subject matter of Example 18 optionally includes wherein depositing the sacrificial film comprises depositing a resist material onto the first substrate.

In Example 20, the subject matter of any one or more of Examples 18-19 optionally include wherein depositing the sacrificial film comprises depositing a thermal decomposable polymer onto the first substrate.

In Example 21, the subject matter of any one or more of Examples 18-20 optionally include wherein removing the exposed portions of the photo-imageable material comprises forming a concave portion in the photo-imageable material.

In Example 22, the subject matter of any one or more of Examples 18-21 optionally include wherein removing the exposed portions of the photo-imageable material comprises forming a planar portion in the photo-imageable material.

In Example 23, the subject matter of any one or more of Examples 18-22 optionally include planarizing a top surface of the traces and the sacrificial film.

In Example 24, the subject matter of any one or more of Examples 18-23 optionally include removing any remaining portions of the hard mask prior to removal of the sacrificial film.

In Example 25, the subject matter of any one or more of Examples 18-24 optionally include wherein forming the traces comprises forming at least one electrically non-functional trace.

In Example 26, the microelectronics packages, systems, apparatuses, or method of any one or any combination of Examples 1-25 can optionally be configured such that all elements or options recited are available to use or select from.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72 (b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

What is claimed is:

1. A microelectronics package, comprising:

a first trace on a first substrate and comprising a first sidewall;

a second trace on the first substrate and comprising a second sidewall, the second trace spaced a distance from the first trace with the second sidewall facing the first sidewall;

first and second portions of a photosensitive material on the first sidewall and the second sidewall, respectively; and a second substrate on the first and second traces, the first and second substrates and the first and second traces forming an air gap between the first and second traces.

2. The microelectronics package of claim 1, wherein the first and second sidewalls each are substantially planar.

3. The microelectronics package of claim 1, wherein each of the first and second sidewalls form a tapered undercut region.

4. The microelectronics package of claim 1, wherein surfaces of the photosensitive material exposed to the air gap have a curved profile.

5. The microelectronics package of claim 1, wherein the first and second sidewalls each are concaved.

6. The microelectronics package of claim 1, wherein surfaces of the photosensitive material exposed to the air gap form a tapered undercut region.

7. The microelectronics package of claim 1, further comprising:

a mechanical support between the first and second substrates and spaced apart from a third trace, the mechanical support comprising a third sidewall facing the third trace; and a third portion of the photosensitive material on the third sidewall, wherein the first and second substrates, the third trace, and the mechanical support form a second air gap.

8. The microelectronics package of claim 7, wherein the mechanical support is grounded to provide a ground plane.

9. A microelectronics package, comprising:

a plurality of traces on a first substrate and spaced apart from one another; and a second substrate on the plurality of traces, wherein each of the plurality of traces comprises:

a first sidewall having a first portion of a photosensitive material thereon; and a second sidewall having a second portion of the photosensitive material thereon, the first sidewall of a first of the plurality of traces facing the second sidewall of a second of the plurality of traces, and wherein the first and second substrates and the plurality of traces form a plurality of air gaps between respective ones of the plurality of traces.

10. The microelectronics package of claim 9, wherein the first and second sidewalls of at least a subset of the plurality of traces are substantially planar.

11. The microelectronics package of claim 9, wherein the first and second sidewalls of at least a subset of the plurality of traces form tapered undercut regions.

12. The microelectronics package of claim 9, wherein surfaces of the photosensitive material exposed to the air gaps have a curved profile.

13. The microelectronics package of claim 9, wherein the first and second sidewalls of at least a subset of the plurality of traces are concaved.

14. The microelectronics package of claim 9, wherein surfaces of the photosensitive material exposed to the plurality of air gaps form tapered undercut regions.

15. The microelectronics package of claim 9, further comprising:

a mechanical support between the first and second substrates and spaced apart from a third of the plurality of traces, the mechanical support comprising a third sidewall facing the third of the plurality of traces; and a third portion of the photosensitive material on the third sidewall, wherein the first and second substrates, the third of the plurality of traces, and the mechanical support form a second air gap.

16. The microelectronics package of claim 15, wherein the mechanical support is grounded to provide a ground plane.

17. A microelectronics package, comprising:

a first trace and a second trace each on a first substrate, the first trace comprising a first sidewall and the second trace comprising a second sidewall facing the first sidewall;

a first portion and a second portion of a photosensitive material on the first sidewall and the second sidewall, respectively;

a second substrate on the first trace and the second trace; and an air gap defined by the first substrate, the second substrate, the first trace, and the second trace.

18. The microelectronics package of claim 17, wherein the first sidewall and the second sidewall each are substantially planar.

19. The microelectronics package of claim 17, wherein each of the first sidewall and the second sidewall forms a tapered undercut region.

20. The microelectronics package of claim 17, wherein surfaces of the photosensitive material exposed to the air gap have a curved profile.

21. The microelectronics package of claim 17, wherein the first sidewall and the second sidewall each are concaved.

22. The microelectronics package of claim 17, wherein surfaces of the photosensitive material exposed to the air gap form a tapered undercut region.

23. The microelectronics package of claim 17, further comprising:

a mechanical support between the first substrate and the second substrate and spaced apart from a third trace, the mechanical support comprising a third sidewall facing the third trace;

a third portion of the photosensitive material on the third sidewall; and a second air gap defined by the first substrate, the second substrate, the third trace, and the mechanical support.

24. The microelectronics package of claim 23, wherein the mechanical support is grounded to provide a ground plane.

* * * * *